(12) United States Patent
Li et al.

(10) Patent No.: US 7,302,367 B2
(45) Date of Patent: Nov. 27, 2007

(54) LIBRARY ACCURACY ENHANCEMENT AND EVALUATION

(75) Inventors: Shifang Li, Pleasanton, CA (US); Junwei Bao, Palo Alto, CA (US); Wei Liu, Santa Clara, CA (US)

(73) Assignee: Timbre Technologies, Inc., Santa Clara, CA (US)

( * ) Notice: Subject to any disclaimer, the term of this patent is extended or adjusted under 35 U.S.C. 154(b) by 0 days.

(21) Appl. No.: 11/390,798

(22) Filed: Mar. 27, 2006

(65) Prior Publication Data
US 2007/0225940 A1    Sep. 27, 2007

(51) Int. Cl.
*G01N 21/88* (2006.01)

(52) U.S. Cl. ............... 702/189; 702/32; 702/81; 702/83; 702/84; 356/625; 356/369; 356/601; 703/2; 703/6

(58) Field of Classification Search ......... 702/189, 702/76, 108, 127, 167, 32, 81, 83, 84; 356/369, 356/600–603, 625, 601; 703/2, 6
See application file for complete search history.

(56) References Cited

U.S. PATENT DOCUMENTS

| 6,943,900 | B2 | 9/2005 | Niu et al. |
| 7,031,894 | B2* | 4/2006 | Niu et al. ............... 703/6 |
| 7,092,110 | B2* | 8/2006 | Balasubramanian et al. ............... 356/625 |
| 2004/0267397 | A1 | 12/2004 | Doddi et al. |
| 2005/0209816 | A1* | 9/2005 | Vuong et al. ............... 702/167 |

* cited by examiner

*Primary Examiner*—Michael P. Nghiem
*Assistant Examiner*—Hien Vo
(74) *Attorney, Agent, or Firm*—Morrison & Foerster LLP

(57) ABSTRACT

The accuracy of a library of simulated-diffraction signals for use in optical metrology of a structure formed on a wafer is evaluated by utilizing an identity relationship inherent to simulated diffraction signals. Each simulated diffraction signal contains at least one set of four reflectivity parameters for a wavelength and/or angle of incidence. One of the four reflectivity parameters is selected. A value for the selected reflectivity parameter is determined using the identity relationship and values of the remaining three reflectivity parameters. The determined value for the selected reflectivity parameter is compared to the value in the obtained set of four reflectivity parameters to evaluate and improve the accuracy of the library. The identity relationship can also be used to reduce the data storage in a library.

22 Claims, 8 Drawing Sheets

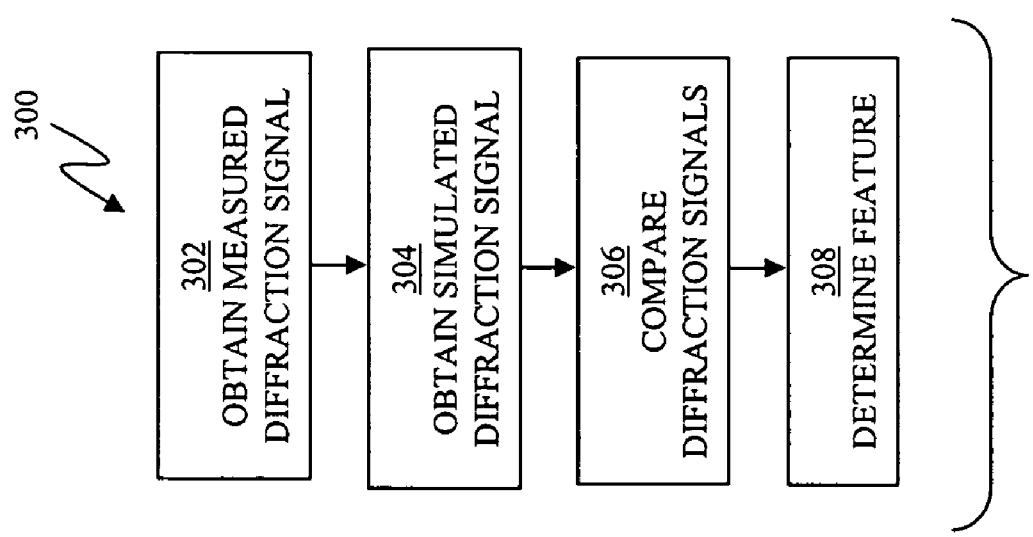

LIBRARY ACCURACY ENHANCEMENT AND EVALUATION

BACKGROUND

1. Field

The present application generally relates to optical metrology, and, more particularly, to evaluating and enhancing a library generated using a machine learning system.

2. Description of the Related Art

In semiconductor manufacturing, periodic gratings are typically used for quality assurance. For example, one typical use of periodic gratings includes fabricating a periodic grating in proximity to the operating structure of a semiconductor chip. The periodic grating is then illuminated with an electromagnetic radiation. The electromagnetic radiation that deflects off of the periodic grating are collected as a diffraction signal. The diffraction signal is then analyzed to determine whether the periodic grating, and by extension whether the operating structure of the semiconductor chip, has been fabricated according to specifications.

In one conventional system, the diffraction signal collected from illuminating the periodic grating (the measured-diffraction signal) is compared to a library of simulated-diffraction signals. Each simulated-diffraction signal in the library is associated with a hypothetical profile. When a match is made between the measured-diffraction signal and one of the simulated-diffraction signals in the library, the hypothetical profile associated with the simulated-diffraction signal is presumed to represent the actual profile of the periodic grating.

The library of simulated-diffraction signals can be generated using rigorous method, such as rigorous coupled wave analysis (RCWA). More particularly, in the diffraction modeling technique, a simulated-diffraction signal is calculated based, in part, on solving Maxwell's equations. Calculating the simulated diffraction signal involves performing a large number of complex calculations, which can be time consuming and costly.

An alternative is to generate the library of simulated-diffraction signals using a machine learning system (MLS). Prior to generating the library of simulated-diffraction signals, the MLS is trained using know input and output data. For a library generated using MLS, it is desirable to evaluate the accuracy of the trained system, especially near the boundaries of the library. In particular, as the critical dimension (CD) measured using metrology decreases, it is desirable to increase the accuracy of the library. Additionally, it is desirable to minimize the amounts of information stored in the library.

SUMMARY

In one exemplary embodiment, the accuracy of a library of simulated-diffraction signals for use in optical metrology of a structure formed on a wafer is evaluated by utilizing an identity relationship inherent to simulated diffraction signals. Each simulated diffraction signal contains at least one set of four reflectivity parameters for a wavelength and/or angle of incidence. One of the four reflectivity parameters is selected. A value for the selected reflectivity parameter is determined using the identity relationship and values of the remaining three reflectivity parameters. The determined value for the selected reflectivity parameter is compared to the value in the obtained set of four reflectivity parameters to evaluate and improve the accuracy of the library. The identity relationship can also be used to reduce the data storage in a library.

DESCRIPTION OF THE DRAWING FIGURES

The present application can be best understood by reference to the following description taken in conjunction with the accompanying drawing figures, in which like parts may be referred to by like numerals:

FIG. 3 depicts an exemplary process of determining a feature of a structure using a machine learning system;

DETAILED DESCRIPTION

The following description sets forth numerous specific configurations, parameters, and the like. It should be recognized, however, that such description is not intended as a limitation on the scope of the present invention, but is instead provided as a description of exemplary embodiments.

1. Optical Metrology

Figure 1:
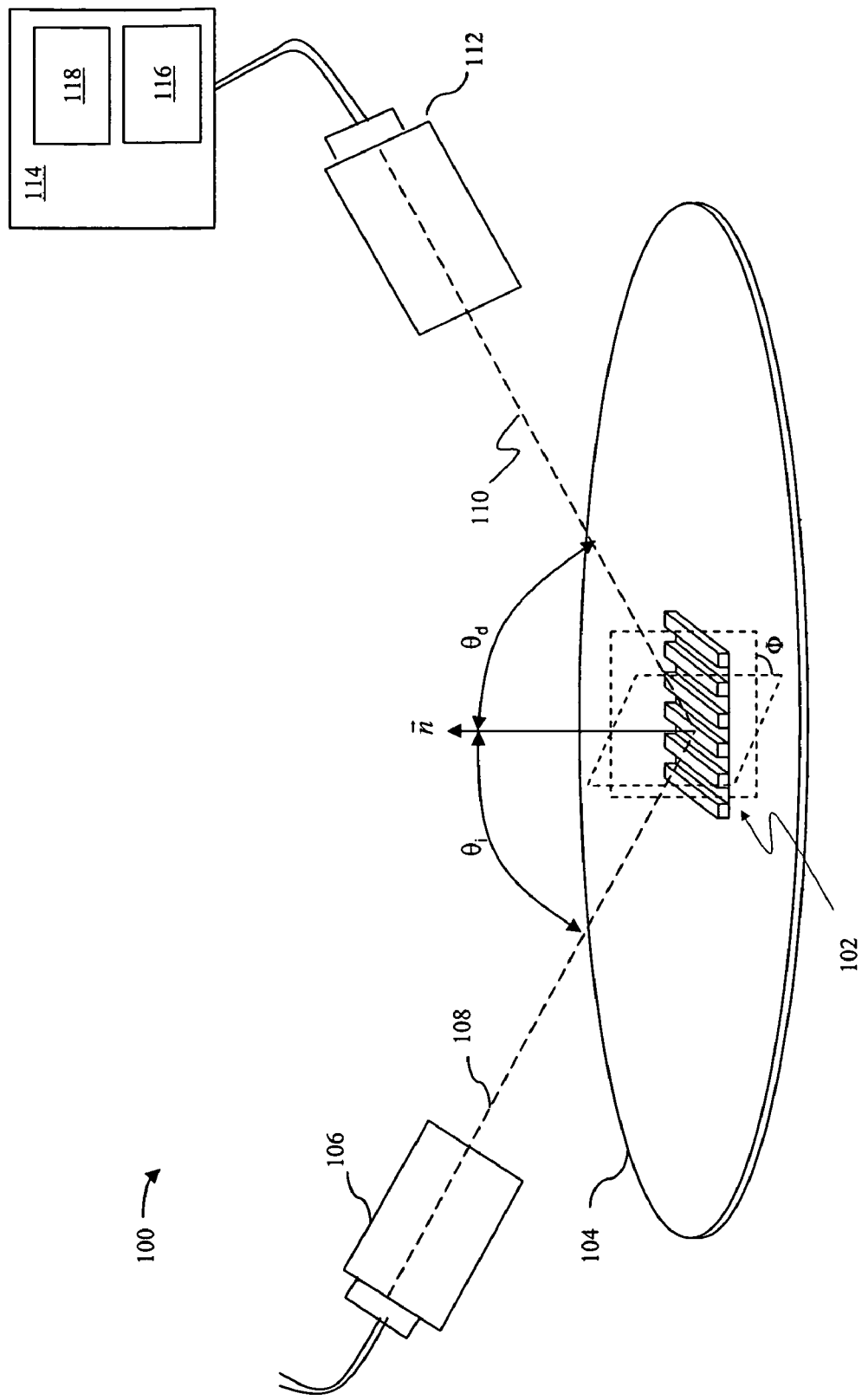
FIG. 1 depicts an exemplary optical metrology system.

With reference to FIG. 1, an optical metrology system 100 can be used to examine and analyze a structure. For example, optical metrology system 100 can be used to determine a feature of a periodic grating 102 formed on wafer 104. As described earlier, periodic grating 102 can be formed in test areas on wafer 104, such as adjacent to a device formed on wafer 104. Alternatively, periodic grating 102 can be formed in an area of the device that does not interfere with the operation of the device or along scribe lines on wafer 104.

As depicted in FIG. 1, optical metrology system 100 can include an optical metrology device with a source 106 and a detector 112. Periodic grating 102 is illuminated by an incident beam 108 from source 106. In the present exemplary embodiment, incident beam 108 is directed onto periodic grating 102 at an angle of incidence $\theta_i$ with respect to normal of periodic grating 102 and an azimuth angle $\Phi$ (i.e., the angle between the plane of incidence beam 108 and the direction of the periodicity of periodic grating 102). Diffracted beam 110 leaves at an angle of $\theta_d$ with respect to normal, and is received by detector 112. Detector 112 converts the diffracted beam 110 into a measured diffraction signal, which can include reflectance, tan ($\Psi$), cos ($\Delta$), Fourier coefficients, and the like.

Optical metrology system 100 also includes a processing module 114 configured to receive the measured diffraction signal and analyze the measured diffraction signal. As described below, a feature of periodic grating 102 can then be determined using a library-based process.

2. Library-Based Process

In a library-based process, the measured diffraction signal is compared to a library of simulated diffraction signals. More specifically, each simulated diffraction signal in the library is associated with a hypothetical profile of the structure. When a match is made between the measured diffraction signal and one of the simulated diffraction signals in the library or when the difference between the measured diffraction signal and one of the simulated diffraction signals in the library is within a preset or matching criterion, the hypothetical profile associated with the matching simulated diffraction signal in the library is presumed to represent the profile of the structure. Thus, in this manner, a feature of the structure can be determined based on the hypothetical profile associated with the matching simulated diffraction signal.

With reference again to FIG. 1, after obtaining a measured diffraction signal, processing module 114 compares the measured diffraction signal to simulated diffraction signals stored in a library 116. Each simulated diffraction signal in library 116 is associated with a hypothetical profile. When a match is made between the measured diffraction signal and one of the simulated diffraction signals in library 116, the hypothetical profile associated with the matching simulated diffraction signal in library 116 can be presumed to represent the profile of periodic grating 102.

The set of hypothetical profiles stored in library 116 can be generated by characterizing a hypothetical profile using a set of parameters, then varying the set of parameters to generate hypothetical profiles of varying shapes and dimensions. The process of characterizing a hypothetical profile using a set of parameters can be referred to as parameterizing.

Figure 2E:
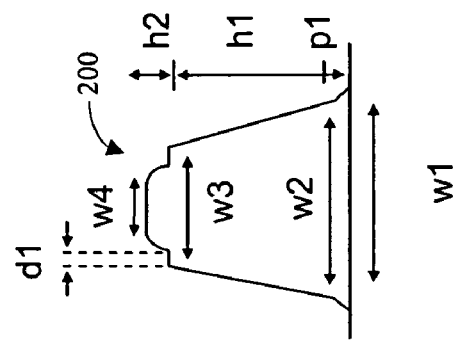
FIGS. 2A-2E depict exemplary hypothetical profiles.
Figure 2C:
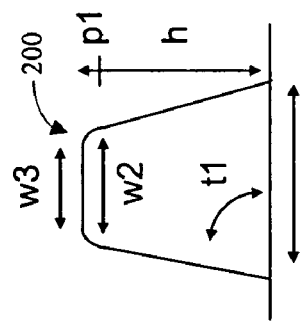
Figure 2D:
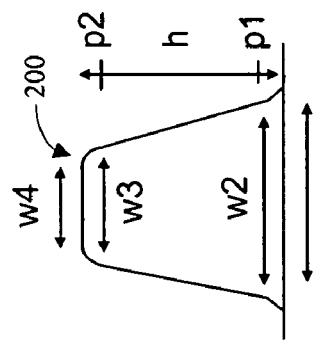
Figure 2A:
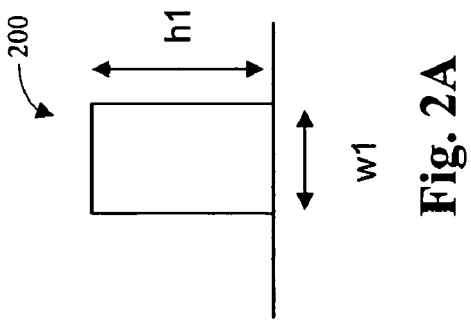
Figure 2B:
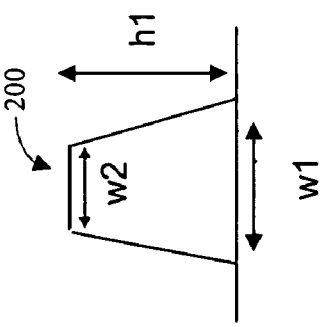

For example, as depicted in FIG. 2A, assume that hypothetical profile 200 can be characterized by parameters h1 and w1 that define its height and width, respectively. As depicted in FIGS. 2B to 2E, additional shapes and features of hypothetical profile 200 can be characterized by increasing the number of parameters. For example, as depicted in FIG. 2B, hypothetical profile 200 can be characterized by parameters h1, w1, and w2 that define its height, bottom width, and top width, respectively. Note that the width of hypothetical profile 200 can be referred to as the critical dimension (CD). For example, in FIG. 2B, parameter w1 and w2 can be described as defining the bottom CD and top CD, respectively, of profile 200. It should be recognized that various types of parameters can be used to characterize hypothetical profile 200, including angle of incident (AOI), pitch, n & k, hardware parameters (e.g., polarizer angle), and the like.

As described above, the set of hypothetical profiles stored in library 116 (FIG. 1) can be generated by varying the parameters that characterize the hypothetical profile. For example, with reference to FIG. 2B, by varying parameters h1, w1, and w2, profiles of varying shapes and dimensions can be generated. Note that one, two, or all three parameters can be varied relative to one another.

Thus, the parameters of the hypothetical profile associated with a matching simulated diffraction signal can be used to determine a feature of the structure being examined. For example, a parameter of the hypothetical profile corresponding to a bottom CD can be used to determine the bottom CD of the structure being examined.

With reference again to FIG. 1, the number of hypothetical profiles and corresponding simulated diffraction signals in the set of hypothetical profiles and simulated diffraction signals stored in library 116 (i.e., the resolution and/or range of library 116) depends, in part, on the range over which the set of parameters and the increment at which the set of parameters are varied. In one exemplary embodiment, the hypothetical profiles and the simulated diffraction signals stored in library 116 are generated prior to obtaining a measured diffraction signal from an actual structure. Thus, the range and increment (i.e., the range and resolution) used in generating library 116 can be selected based on familiarity with the fabrication process for a structure and what the range of variance is likely to be. The range and/or resolution of library 116 can also be selected based on empirical measures, such as measurements using atomic force microscopy (AFM), scanning electron microscopy (SEM), and the like.

For a more detailed description of a library-based process, see U.S. patent application Ser. No. 09/907,488, titled GENERATION OF A LIBRARY OF PERIODIC GRATING DIFFR5TION SIGNALS, filed on Jul. 16, 2001, which is incorporated herein by reference in its entirety.

3. Machine Learning Systems

With reference to FIG. 1, in one exemplary embodiment, a MLS 118 can be used to examine a structure formed on a semiconductor wafer. MLS 118 employs a machine learning algorithm, such as back-propagation, radial basis function, support vector, kernel regression, and the like. For a more detailed description of MLS and machine learning algorithms, see "Neural Networks" by Simon Haykin, Prentice Hall, 1999, which is incorporated herein by reference in its entirety.

In the present exemplary embodiment, MLS 118 has been trained to receive a hypothetical profile as an input and generate a simulated diffraction signal as an output. Although in FIG. 1 MLS 118 is depicted as a component of processing module 114, it should be recognized that MLS 118 can be a separate module. It should be recognized that processing module 114 need not include both library 116 and MLS 118.

FIG. 3 depicts an exemplary process 300 for using a MLS to examine a structure formed on a semiconductor wafer. In 302, a measured diffraction signal of the structure is obtained by using an optical metrology device. In 304, after the MLS has been trained, a simulated diffraction signal is generated using the MLS. In 306, the measured and simulated diffraction signals are compared. In 308, a feature of the structure is determined based on the comparison of the measured and simulated diffraction signals.

More particularly, as described above, a hypothetical profile is used as an input to the MLS to generate the simulated diffraction signal. The hypothetical profile is characterized by one or more parameters. Thus, when the simulated diffraction signal matches the measured diffraction signal within a matching criterion, the hypothetical profile, and thus the one or more parameters that characterize the hypothetical profile, can be used to determine a feature of the structure.

When the simulated diffraction signal does not match the measured diffraction signal within a matching criterion, another hypothetical profile is used as an input to the MLS to generate another simulated diffraction signal. This new simulated diffraction signal is then compared with the measured diffraction signal. This process can be iterated until a simulated diffraction signal is generated that matches the measured diffraction signal within the matching criterion.

With reference to FIG. 1, in one exemplary embodiment, an MLS is used to generate a library of simulated diffraction signals and hypothetical profiles. In particular, the simulated diffraction signals in the library are generated using the MLS.

In particular, a set of hypothetical profiles to be included in the library are inputted into the MLS, which then generates a set of simulated diffraction signals corresponding to the set of hypothetical profiles. A hypothetical profile and the corresponding simulated diffraction signal generated for the hypothetical profile using the MLS is stored as a hypothetical profile and simulated diffraction signal pair in the library. In this manner, each of the hypothetical profiles in the set of hypothetical profiles and each of the simulated diffraction signals in the set of simulated diffraction signals are stored as hypothetical profile and diffraction signal pairs in the library.

Figure 4:
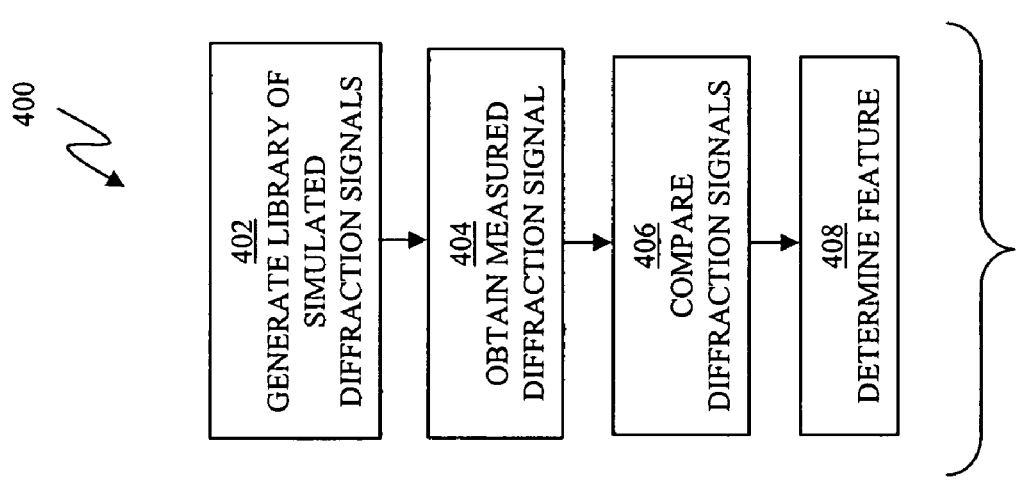
FIG. 4 depicts an exemplary process of determining a feature of a structure using a machine learning system in a library-based process.

With reference to FIG. 4, an exemplary process 400 is depicted for using a MLS in a library-based process. In 402, a library of simulated diffraction signals is generated using the MLS. More particularly, the library of simulated diffraction signals is generated by inputting a set of hypothetical profiles into the MLS. In 404, a measured diffraction signal is obtained using a metrology device, such as an ellipsometer, reflectometer, and the like. In 406, the measured diffraction signal is compared to the simulated diffraction signals in the library of simulated diffraction signals generated using the MLS. In 408, a feature of the structure is determined using the hypothetical profile corresponding to the matching simulated diffraction signal from the library of simulated diffraction signals.

For a more detailed description of generating a library of simulated diffraction signals using MLS see U.S. patent application Ser. No. 10/608,300, titled OPTICAL METROLOGY OF STRUCTURES FORMED ON SEMICONDUCTOR WAFERS USING MACHINE LEARNING SYSTEMS, filed on Jun. 27, 2003, which is hereby incorporated by reference in its entirety.

4. Library Accuracy Enhancement and Evaluation

In one exemplary embodiment, optical information from the simulated diffraction signals generated by the MLS to create a library of simulated diffraction signals can be used to test the accuracy of the library of simulated diffraction signals.

Light at a given wavelength and angle of incidence which scatters off a classical grating mount has two independent complex reflectance parameters contained within the diffraction signal, $r_s$ and $r_p$, which can be used to describe the interaction of the light with the grating. The intensity of the reflected light is related to the complex reflectance parameters according to the following relationship:

$$I_{out} \propto |E_{out}|^2 = \frac{1}{2} I_{in} f(|r_s|^2 + |r_p|^2 \pm 2\text{Re}(r_s r_p^* e^{i\phi})). \quad (1)$$

$f(|r_s|^2+|r_p|^2 \pm 2\text{Re}(r_s r_p^* e^{i\phi}))$ is a function which describes the effect of the reflecting surface on the incident beam $I_{in}$. $I_{out}$ is the intensity of the reflected light beam, for a give wavelength and angle of incidence. $E_{out}$ is the electric field of the reflected beam. $\phi$ is the common phase between the complex reflectance parameters.

When the incident beam is linearly polarized at a 45° angle relative to the plane of incidence equation (1) simplifies to the following:

$$I_{out} \propto |E_{out}|^2 = \frac{1}{2} I_{in}(|r_s|^2 + |r_p|^2 \pm 2\text{Re}(r_s r_p^* e^{i\phi})). \quad (2)$$

If $\phi$ is 0 or $\pi$, then equation (2) further simplifies to:

$$I_{out} \propto |E_{out}|^2 = \frac{1}{2} I_{in}(|r_s|^2 + |r_p|^2 \pm 2\text{Re}(r_s r_p^*)). \quad (3)$$

If $\phi$ is $\pi/2$ or $3\pi/2$, then equation (2) further simplifies to:

$$I_{out} \propto |E_{out}|^2 = \frac{1}{2} I_{in}(|r_s|^2 + |r_p|^2 \pm 2\text{Im}(r_s r_p^*)). \quad (4)$$

Thus, in order to generate a simulated diffraction signal for a given profile, four reflectivity parameters, $|r_s|^2$, $|r_p|^2$, $\text{Re}(r_s r_p^*)$, and $\text{Im}(r_s r_p^*)$, may be needed. Which parameters are needed will depend on the experimental design, for which the simulated diffraction signal is being generated.

Currently available optical metrology devices are typically sensitive only to $|r_s|^2$, $|r_p|^2$, and $\text{Re}(r_s r_p^*)$. They are not typically sensitive to $\text{Im}(r_s r_p^*)$, which represents the common phase of $r_s$ and $r_p$. It can be shown that the four parameters, $|r_s|^2$, $|r_p|^2$, $\text{Re}(r_s r_p^*)$, and $\text{Im}(r_s r_p^*)$, are related through the following identity relationship:

$$\text{Re}(r_p^* r_s)^2 + \text{Im}(r_p^* r_s)^2 - |r_s|^2 \times |r_p|^2 = 0. \quad (5)$$

Thus, only $|r_s|^2$, $|r_p|^2$, and $\text{Re}(r_s r_p^*)$ may need to be measured, and then equation (5) used to calculate $\text{Im}(r_s r_p^*)$.

Given a hypothetical profile, a MLS can be trained to simulate the four reflectivity parameters, $|r_p|^2$, $|r_s|^2$, $\text{Re}(r_p^* r_s)$, and $\text{Im}(r_p^* r_s)$, for a given wavelength and/or incident angle. All four reflectivity parameters can be trained and stored as a whole or subgroups, such as group 1 of $[|r_p|^2, |r_s|^2]$ and group 2 of $[\text{Re}(r_s r_p^*), \text{Im}(r_s r_p^*)]$. Because of limitations present in a MLS used to generate each of the four reflectivity parameters, each individual reflectivity parameter may not be accurate. One such limitation is that the data used to train the MLS is not representative of the boundaries of the library, and may lead to larger errors in the four reflectivity parameters associated with the hypothetical profiles present in the boundary regions.

For example a few nm error for calculating the critical dimension of a trained set of data, which is fairly common with current MLS technologies, will propagate to much larger values near the boundaries of a library. These errors become more important for small critical dimension less than 70 nm. Thus, in one exemplary embodiment, the accuracy of the four reflectivity parameters simulated by the MLS can be tested using the identity relationship of the four reflectivity parameters (equation (5)).

In particular, in the present exemplary embodiment, an acceptance criterion can be set to ensure that the reflectivity parameters are accurate within the acceptance criterion. A value of one of the four reflective parameters is generated using the values of the remaining three reflectivity parameters from the four reflectivity parameters simulated by the MLS and the identity relationship of the four reflectivity parameters (equation (5)). For example, a value of the reflectivity parameter $\text{Im}(r_s r_p^*)$ can be generated using the values of $|r_s|^2$, $|r_p|^2$, and $\text{Re}(r_s r_p^*)$ from the four reflectivity parameters simulated by the MLS and the identity relationship of the four reflectivity parameters. The value of the reflectivity parameter generated using the identity relationship is then compared with the value of the corresponding reflectivity parameter of the four reflectivity parameters simulated by the MLS. For example, a value of the reflectivity parameter $Im(r_s r^*_p)$ generated using the identity relationship and a value of the reflectivity parameter $Im(r_s r^*_p)$ from the four reflectivity parameters simulated by the MLS are compared. If the two values of the reflectivity parameter $Im(r_s r^*_p)$ are not within the acceptance criterion, then the amount of error can be determined to be unacceptable.

Figure 5:
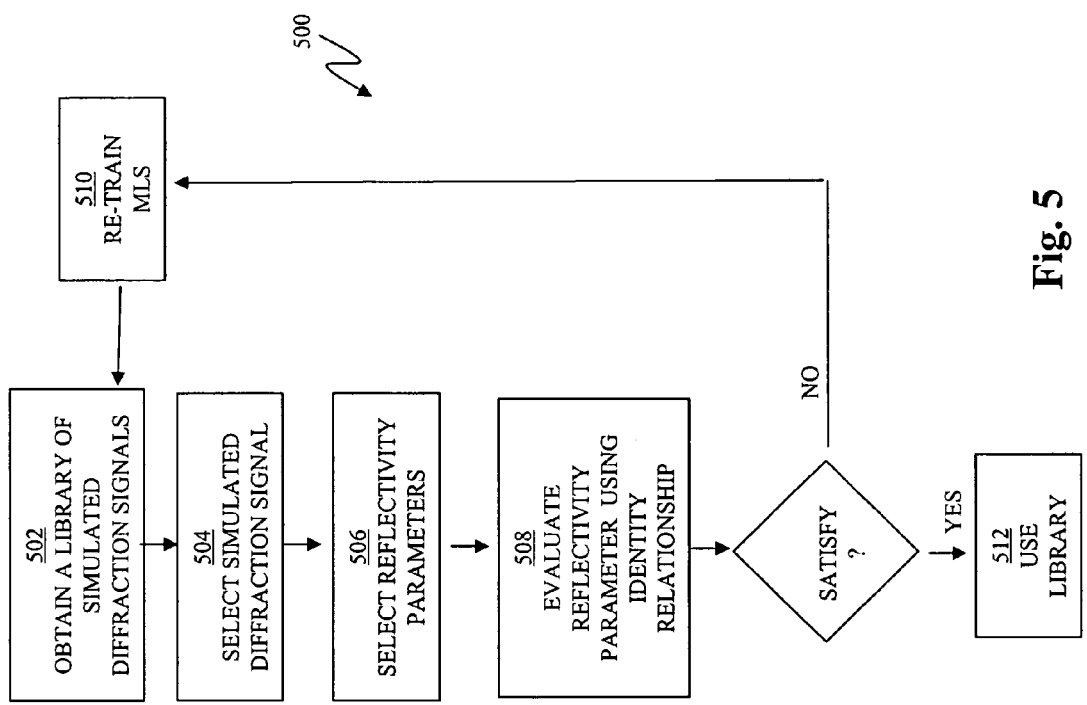
FIG. 5 depicts an exemplary process of evaluating the accuracy of library of simulated diffraction signals generated using a machine learning system.

With reference to FIG. 5, an exemplary process 500 is depicted for evaluating a library of simulated diffraction signals generated using a MLS. In 502, a library of simulated diffraction signals is obtained. In the present exemplary embodiment, the obtained library was generated using an MLS. More particularly, the library of simulated diffraction signals was generated by inputting a set of hypothetical profiles into the MLS to generate the set of simulated diffraction signals for the set of hypothetical profiles. A hypothetical profile and the corresponding simulated diffraction signal generated for the hypothetical profile using the MLS is stored as a hypothetical profile and simulated diffraction signal pair in the library. In this manner, each of the hypothetical profiles in the set of hypothetical profiles and each of the simulated diffraction signals in the set of simulated diffraction signals are stored as hypothetical profile and diffraction signal pairs in the library.

In 504, at least one of the simulated diffraction signals from the library is selected. In 506, at least one set of four reflectivity parameters for a given wavelength and/or angle of incidence is selected from the selected simulated diffraction signal. In 508, the at least one set of four reflectivity parameters is evaluated using the identity relationship of the four reflectivity parameters (equation (5)).

In 510, if the reflectivity parameters do not satisfy the identity relationship, then the library is determined to be unacceptable. In the present exemplary embodiment, the MLS is retrained and a new library of simulated diffraction signals is generated. The process is repeated until the at least one set of four reflectivity parameters satisfy the identity relationship.

In 512, if the four reflectivity parameters satisfy the identity relationship, then the library is determined to be acceptable. The library can then be used to evaluate structures formed on a semiconductor wafer.

Figure 6:
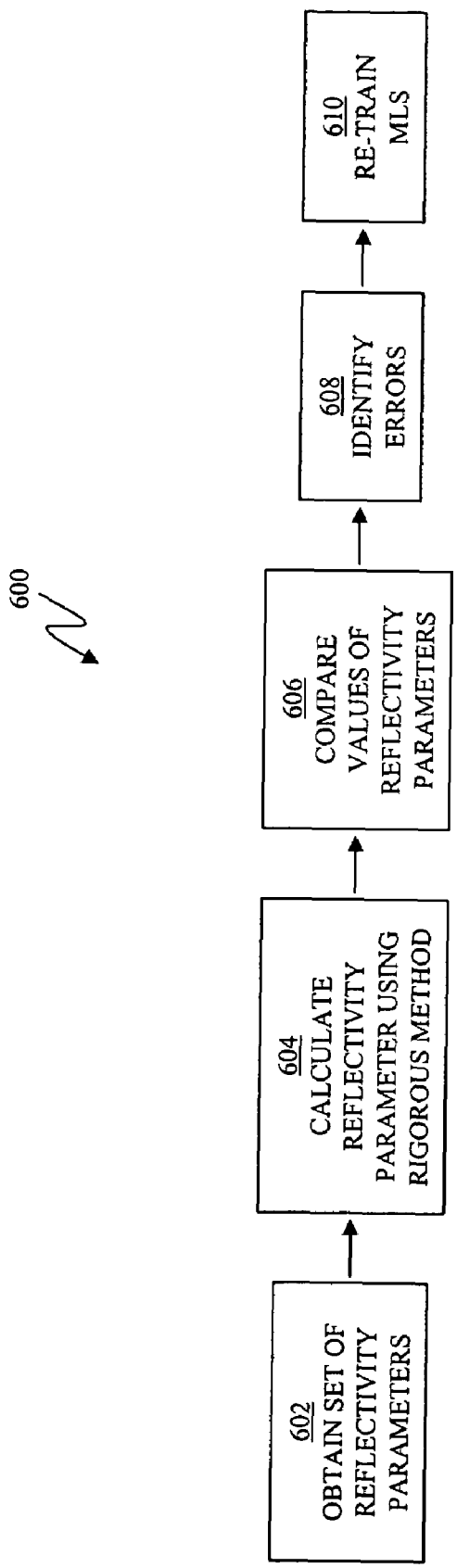
FIG. 6 depicts an exemplary process of evaluating the error in the individual reflectivity parameters.

With reference to FIG. 6, an exemplary process 600 is depicted for evaluating errors in the reflectivity parameters. In 602, the set of four reflectivity parameters that did not satisfy the identity relationship is obtained. In 604, an additional set of reflectivity parameters is generated using a rigorous method, such as RCWA. In 606, the values of the reflectivity parameters calculated using the MLS and the rigorous method, such as RCWA are compared. In 608, the errors in the MLS parameters are identified based on the comparison in 608. In 610, the information about the errors in the MLS parameters identified in 608 is used to retrain the MLS.

Figure 7:
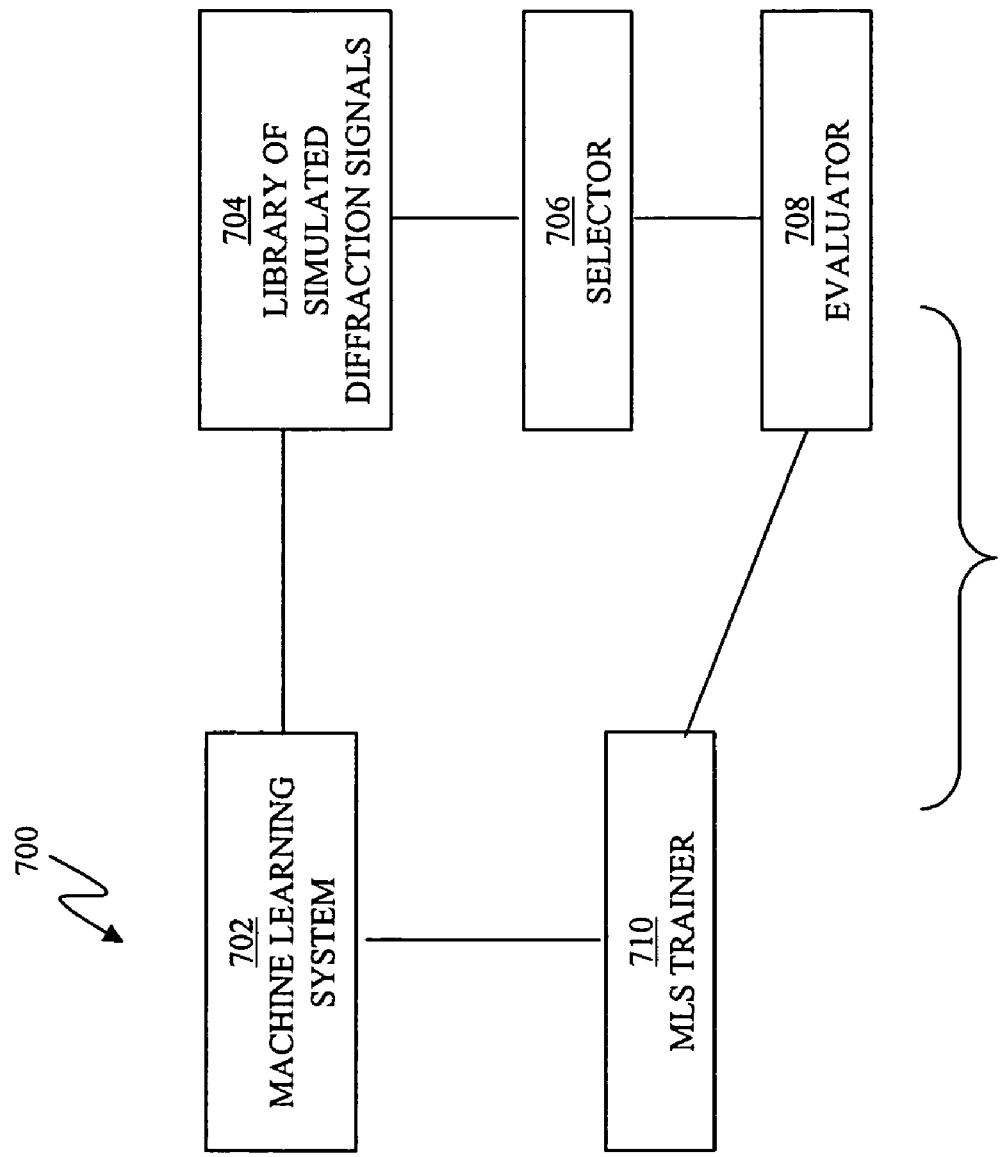
FIG. 7 depicts a system for evaluating the accuracy of a library of simulated diffraction signals generated using a machine learning system.

With reference to FIG. 7, a system, 700, for evaluating a library of simulated diffraction signals is depicted. The system includes a machine learning system 702 to generate a library of simulated diffraction signals 704. A selector 706 configured to select at least one set of four reflectivity parameters is connected to the library of diffraction signals 704.

Selector 706 is also connected to an evaluator 708. Evaluator 708 is configured to evaluate the at least one set of four reflectivity parameters according to the identity relationship (equation 5). Evaluator 708 can also be configured to generate at least one set of four reflectivity parameters using a rigorous method, such as RCWA. The set of four reflectivity parameters generated using the MLS and the set of four reflectivity parameters generated using RCWA can then be compared and used to evaluate the error in each of the individual reflectivity parameters.

Evaluator 708 is connected to a MLS trainer 710, which is configured to obtain error information from evaluator 708 and use that information to train MLS 702. MLS trainer 710 is also configured to initially train MLS 702 prior to generation of the initial library of simulated diffraction signals. A detailed description of generating a library of simulated diffraction signals using MLS is discussed in U.S. patent application Ser. No. 10/608,300, titled OPTICAL METROLOGY OF STRUCTURES FORMED ON SEMICONDUCTOR WAFERS USING MACHINE LEARNING SYSTEMS, filed on Jun. 27, 2003, which is hereby incorporated by reference in its entirety.

In one exemplary embodiment, the four reflectivity parameters for each wave length and incident angle of each simulated diffraction signal in the library are tested to see if they satisfy the identity relationship (equation 4). For example, following the generation of a library of simulated diffraction signals using a MLS, the sets of four reflectivity parameters for each wave length and incident angle of the simulated diffraction signals in the library are selected and evaluated using the identity relationship. An error for each set of four reflectivity parameters is then evaluated and grouped together to generate an error for the library of simulated diffraction signals as a whole. The error can then be used to decide if the MLS needs to be retrained and/or if the library of simulated diffraction signals needs to be generated. As described above, an acceptance criterion can be used to determine if the amount of error is acceptable.

In one exemplary embodiment, instead of using the four reflectivity parameters for each wave length and/or incident angle of each simulated diffraction signal in the library of simulated diffraction signals, a range of wave lengths and/or a range of incident angles of at least one simulated diffraction signal in the library are tested to see if they satisfy the identity relationship (equation 5). An amount of error can be calculated and used to evaluate the accuracy of the library of simulated diffraction signals.

In one exemplary embodiment, the four reflectivity parameters for each wavelength and/or angle of incidence for a range of simulated diffraction signals in the library are tested to see if they satisfy the identity relationship (equation 5). An amount of error can be calculated and used to evaluate the accuracy of the library of simulated diffraction signals.

In one exemplary embodiment, the four reflectivity parameters for each wavelength and/or angle of incidence for a random set of simulated diffraction signals in the library are tested to see if they satisfy the identity relationship (equation 5). An amount of error can be calculated and used to evaluate the accuracy of the library of simulated diffraction signals.

In one exemplary embodiment, the four reflectivity parameters for each wavelength and/or angle of incidence for a set of simulated diffraction signals present at the boundaries of the library are tested to see if they satisfy the identity relationship (equation 5). An amount of error can be calculated and used to evaluate the accuracy of the library of simulated diffraction signals.

5. Reduction in Data Stored in a Library

In one exemplary embodiment, the identity relationship (equation 5) can be used to reduce the complexity of a library of simulated diffraction signals generated using a MLS. The amount of data, $N_d$, which needs to be stored in a library of simulated diffraction signals can described by the following:

$$N_d = \lambda \times P \times AOI \times 4. \tag{6}$$

$\lambda$ is the number of different wavelengths which make up the simulated diffraction signal. P is the number of hypothetical profiles in the library of simulated diffraction signals. AOI is the number of angle of incidences which make up the simulated diffraction signal.

The factor of 4 in equation 6 takes into account the four reflectivity parameters which are needed to calculate the simulated diffraction signal for a given wavelength and/or angle of incidence. Instead of training the library to store all four reflectivity parameters for a given wavelength and/or angle of incidence of a hypothetical profile, three of the four parameters can be trained and stored. This reduces the amount of data stored in the library by 25%. If the fourth reflectivity parameter is needed, then the identity relationship (equation 5) can be used to generate the fourth reflectivity parameters.

Figure 8:
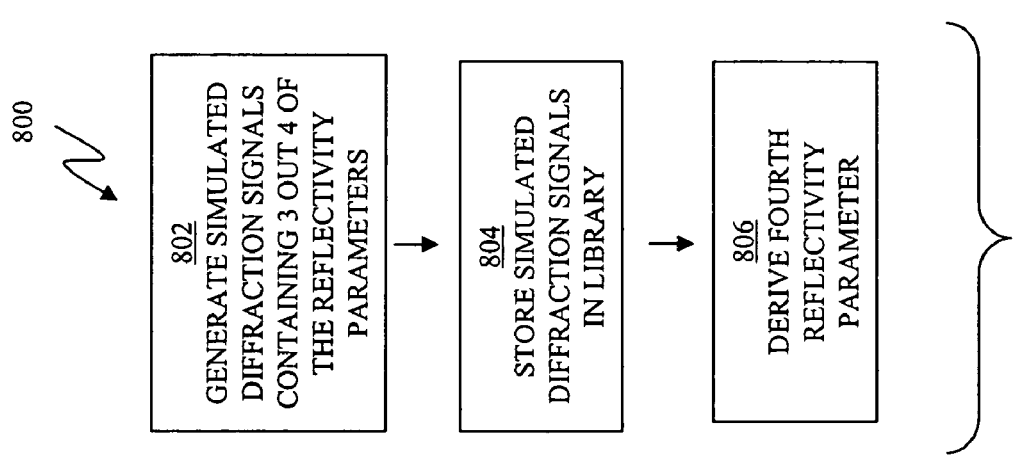
FIG. 8 depicts an exemplary process for reducing the amount of data stored in a library of simulated diffraction signals.

FIG. 8 depicts an exemplary process 800 for reducing the amount of data stored in a library of simulated diffraction signals. In 802, a set of simulated diffraction signals containing three of the four reflectivity parameters for each wavelength and/or angle incidence for a set of hypothetical profiles is generated using a MLS. In 804, the set of simulated diffraction signals and set of hypothetical profiles are stored in the library. In 806, the fourth reflectivity parameter for each wavelength and/or angle incidence for the set of diffraction signals is derived using the identity relationship (equation 5) and the three reflectivity parameters retrieved from the library.

Although exemplary embodiments have been described, various modifications can be made without departing from the spirit and/or scope of the present invention. Therefore, the present invention should not be construed as being limited to the specific forms shown in the drawings and described above.

We claim:

1. A method for evaluating the accuracy of a library of simulated-diffraction signals for use in optical metrology of a structure formed on a wafer, the method comprising:
   a) obtaining a library of simulated diffraction signals;
   b) obtaining at least one set of four reflectivity parameters for a wavelength and/or angle of incidence of at least one simulated diffraction signal from the library;
   c) selecting one of the four reflectivity parameters; and
   d) determining a value for the reflectivity parameter selected in c) using an identity relationship for the four reflectivity parameters and values of the remaining three reflectivity parameters of the at least one set of four reflectivity parameters obtained in b); and
   e) comparing the value determined in d) for the reflectivity parameter selected in c) to the value in the set of four reflectivity parameters obtained in b) for the reflectivity parameter selected in c) to evaluate the accuracy of the library.

2. The method according to claim 1, where the library of simulated diffraction signals is generated using a machine learning system.

3. The method according to claim 1, further comprising:
   generating a new library of simulated diffraction signals if the difference in the values compared in e) is not within an acceptance criterion.

4. The method according to claim 3, wherein the library of simulated diffraction signals and the new library of simulated diffraction signals are generated using a MLS.

5. The method according to claim 4, further comprising:
   re-training the MLS prior to generating the new library of simulated diffraction signals.

6. The method according to claim 5, further comprising:
   determining a value for the reflectivity parameter selected in c) using a rigorous method; and
   comparing the value determined in d) to the value determined using the rigorous method.

7. The method according to claim 6, wherein the rigorous method is rigorous coupled-wave analyses.

8. The method according to claim 1, wherein the at least one set of four reflectivity parameters is obtained from a simulated diffraction signal randomly selected from the library of simulated diffraction signals.

9. The method according to claim 1, wherein the at least on set of four reflectivity parameters is obtained from a simulated diffraction signal near a boundary of the library of simulated diffraction signals.

10. The method according to claim 1, wherein b) to d) are iterated for a range of wavelengths and/or angle of incidences of the at least one simulated diffraction signal from the library of simulated diffraction signals.

11. The method according to claim 1, wherein b) to d) are iterated for a set of simulated diffraction signals from the library of simulated diffraction signals.

12. A method of generating a library of simulated diffraction signals for use in optical metrology of a structure formed on a wafer, the method comprising:
   a) generating a set of diffraction signals using a first reflectivity parameter, a second reflectivity parameter, and a third reflectivity parameter for a range of wavelengths and/or angles of incidence, wherein the first; second, and third parameters are different, and wherein the first, second, and third parameters are three of four reflectivity parameters; and
   b) storing the set of diffraction signals in a library.

13. The method according to claim 12, further comprising:
   retrieving the first, second, and third reflectivity parameters for a wavelength and/or angle of incidence of a simulated diffraction signal from the library; and
   deriving a fourth reflectivity parameter for the wavelength and/or angle of incidence using an identity relationship for the four reflectivity parameters.

14. The method according to claim 12, wherein the library of simulated diffraction signals and the three of the four reflectivity parameters are generated using a machine learning system.

15. A system for evaluating the accuracy of a library of simulated diffraction signals the system comprising:
   a) a library of simulated diffraction signals;
   b) a selector configured to select at least one set of four reflectivity parameters for a given wavelength and/or angle of incidence of a simulated diffraction signal from the library; and
   c) an evaluator configured to evaluate if the at least one set of four reflectivity parameters satisfy an identity relationship of the four reflectivity parameters.

16. The system according to claim 15, wherein the library generator is a machine learning system.

17. The system according to claim 16, further comprising an MLS trainer configured to train the machine learning system prior to generating a library of simulated diffraction signals, and wherein the MLS trainer is configured to retrain the MLS when the at least one set of the four reflectivity parameters does not satisfy the identity relationship within an acceptance criterion.

18. The system according to claim 16, wherein the evaluator is further configured to generate one of the four reflectivity parameters using a rigorous method, wherein the one reflectivity parameter generated using the rigorous method is compared to one of the four reflectivity parameters retrieved from the library.

19. The system according to claim 18, wherein the rigorous method is RCWA.

20. A computer-readable medium containing computer executable instructions to evaluate the accuracy of a library of simulated-diffraction signals for use in optical metrology of a structure formed on a wafer, comprising instructions for:
   a) obtaining a library of simulated diffraction signals;
   b) obtaining at least one set of four reflectivity parameters for a wavelength and/or angle of incidence of at least one simulated diffraction signal from the library;
   c) selecting one of the four reflectivity parameters; and
   d) determining a value for the reflectivity parameter selected in c) using an identity relationship for the four reflectivity parameters and values of the remaining three reflectivity parameters of the at least one set of four reflectivity parameters obtained in b); and
   e) comparing the value determined in d) for the reflectivity parameter selected in c) to the value in the set of four reflectivity parameters obtained in b) for the reflectivity parameter selected in c) to evaluate the accuracy of the library.

21. A computer-readable medium containing computer executable instructions to generate a library of simulated diffraction signals for use in optical metrology of a structure formed on a wafer, comprising instructions for:
   a) generating a set of diffraction signals using a first reflectivity parameter, a second reflectivity parameter, and a third reflectivity parameter for a range of wavelengths and/or angles of incidence, wherein the first, second, and third parameters are different, and wherein the first, second, and third parameters are three of four reflectivity parameters; and
   b) storing the set of diffraction signals in a library.

22. The computer-readable medium according to claim 21, further comprising instructions for:
   retrieving the first, second, and third reflectivity parameters for a wavelength and/or angle of incidence of a simulated diffraction signal from the library; and
   deriving a fourth reflectivity parameter for the wavelength and/or angle of incidence using an identity relationship for the four reflectivity parameters.

* * * * *